(12) United States Patent
Jeon et al.

(10) Patent No.: US 11,705,064 B2
(45) Date of Patent: *Jul. 18, 2023

(54) ORGANIC LIGHT EMITTING DISPLAY APPARATUS

(71) Applicant: Samsung Display Co., Ltd., Yongin-Si (KR)

(72) Inventors: Sangjin Jeon, Hwaseong-si (KR); Dongwoo Kim, Suwonsi (KR); Sang-Uk Lim, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/497,444

(22) Filed: Oct. 8, 2021

(65) Prior Publication Data
US 2022/0028336 A1    Jan. 27, 2022

Related U.S. Application Data

(63) Continuation of application No. 15/816,068, filed on Nov. 17, 2017, now Pat. No. 11,164,517.

(30) Foreign Application Priority Data

Jan. 6, 2017    (KR) .................. 10-2017-0002483

(51) Int. Cl.
*G09G 3/3233*    (2016.01)
*H01L 27/32*     (2006.01)
(Continued)

(52) U.S. Cl.
CPC ....... *G09G 3/3233* (2013.01); *H01L 27/1225* (2013.01); *H01L 27/1251* (2013.01);
(Continued)

(58) Field of Classification Search
CPC ............... G09G 3/3233; G09G 3/3208; G09G 2320/045; G09G 2320/043; G09G 3/30
See application file for complete search history.

(56) References Cited

U.S. PATENT DOCUMENTS 7,688,292 B2   3/2010  Park et al.
8,767,150 B2   7/2014  Jeon
(Continued)

FOREIGN PATENT DOCUMENTS

CN    1835058 A     9/2006
CN    101404140 A   4/2009
(Continued)

*Primary Examiner* — Yuzhen Shen
(74) *Attorney, Agent, or Firm* — Innovation Counsel LLP

(57) ABSTRACT

An organic light-emitting display apparatus includes an organic light-emitting diode, a switching transistor, a first light emission control transistor, and a driving transistor. The organic light-emitting diode includes an anode and a cathode for receiving a reference voltage. The switching transistor includes a gate electrode for receiving an nth scan signal and a source electrode for receiving a data signal, and is an NMOS transistor. The first light emission control transistor includes a gate electrode for receiving a light emission control signal, and is configured to turn on upon receiving the light emission control signal to determine a timing of flow of a driving current to the organic light-emitting diode, and is a PMOS transistor. The driving transistor is connected to the switching transistor and the first light emission control transistor and provides the driving current to the organic light-emitting diode.

18 Claims, 5 Drawing Sheets

(51) Int. Cl.
*H01L 29/786* (2006.01)
*H01L 27/12* (2006.01)

(52) U.S. Cl.
CPC ...... *H01L 27/1255* (2013.01); *H01L 27/3262* (2013.01); *H01L 29/7869* (2013.01); *H01L 29/78675* (2013.01); *G09G 2300/043* (2013.01); *G09G 2300/0426* (2013.01); *G09G 2300/0814* (2013.01); *G09G 2300/0861* (2013.01); *G09G 2310/0251* (2013.01); *G09G 2310/0262* (2013.01); *G09G 2320/043* (2013.01); *G09G 2320/0626* (2013.01); *G09G 2330/021* (2013.01)

(56) References Cited

U.S. PATENT DOCUMENTS

| | | |
|---|---|---|
| 9,105,589 B2 | 8/2015 | Bang |
| 9,189,994 B2 | 11/2015 | Iida et al. |
| 9,231,039 B2 | 1/2016 | Kim |
| 9,355,594 B2 | 5/2016 | Lee et al. |
| 10,319,297 B2 * | 6/2019 | Morita ................ G02F 1/13452 |
| 10,546,526 B2 * | 1/2020 | Morita ................ H01L 27/1251 |
| 2008/0218497 A1 | 9/2008 | Takahashi |
| 2010/0194716 A1 | 8/2010 | Park |
| 2012/0001893 A1 | 1/2012 | Jeong et al. |
| 2014/0333599 A1 | 11/2014 | Lee et al. |
| 2015/0108482 A1 | 4/2015 | Kim |
| 2015/0170563 A1 | 6/2015 | Bang |
| 2015/0243720 A1 | 8/2015 | Kwon et al. |
| 2016/0087022 A1 | 3/2016 | Tsai et al. |
| 2016/0190221 A1 | 6/2016 | Cho et al. |
| 2016/0247452 A1 | 8/2016 | Lee et al. |
| 2016/0300898 A1 | 10/2016 | Kim |
| 2017/0062539 A1 | 3/2017 | Tsai et al. |
| 2017/0365213 A1 * | 12/2017 | Rieutort-Louis .... G09G 3/3233 |
| 2018/0033808 A1 | 2/2018 | Li |
| 2018/0061311 A1 | 3/2018 | Lin et al. |
| 2018/0151125 A1 * | 5/2018 | Lee ...................... G09G 3/3266 |
| 2018/0151654 A1 | 5/2018 | Lee |
| 2018/0226020 A1 | 8/2018 | Wang et al. |
| 2018/0308412 A1 | 10/2018 | Wu et al. |

FOREIGN PATENT DOCUMENTS

| | | |
|---|---|---|
| CN | 104732917 A | 6/2015 |
| JP | 2015-225104 A | 12/2015 |
| KR | 10-2010-0090137 A | 8/2010 |
| KR | 20140127048 A1 | 11/2014 |
| KR | 10-2015-0071319 A | 6/2015 |
| KR | 20160024191 A | 3/2016 |
| KR | 20160082865 A1 | 7/2016 |
| KR | 20160100050 A1 | 8/2016 |
| KR | 20160120388 A | 10/2016 |

* cited by examiner

ORGANIC LIGHT EMITTING DISPLAY APPARATUS

CROSS-REFERENCE TO RELATED APPLICATIONS

This U.S. non-provisional patent application claims priority under 35 U.S.C. § 119 of Korean Patent Application No. 10-2017-0002483, filed on Jan. 6, 2017, the entire contents of which are hereby incorporated by reference.

BACKGROUND

The present disclosure herein relates to an organic light-emitting display apparatus, and more particularly, to an organic light-emitting display apparatus having two or more different transistors within one pixel.

An organic light-emitting display apparatus includes a plurality of pixels. Each pixel includes an organic light-emitting diode and a circuit unit for controlling the organic light-emitting diode. The circuit unit includes at least a control transistor, a driving transistor, and a storage capacitor.

The organic light-emitting diode includes an anode, a cathode, and an organic light-emitting layer disposed between the anode and the cathode. The organic light-emitting diode emits light when a voltage higher than a threshold voltage of the organic light-emitting layer is applied between the anode and the cathode.

SUMMARY

The present disclosure provides a technology for improving power consumption of a display apparatus without deteriorating display quality thereof by configuring transistors of a pixel such that the transistors have relatively high mobility and reliability and also have a relatively low leakage current.

The present disclosure also provides a technology for accurately displaying a low gray-scale image.

An embodiment of the inventive concept provides an organic light-emitting display apparatus including an organic light-emitting diode, a switching transistor, a first light emission control transistor, and a driving transistor.

In an embodiment, the organic light-emitting diode may include an anode and a cathode for receiving a reference voltage.

In an embodiment, the switching transistor may include a gate electrode for receiving an nth scan signal and a source electrode for receiving a data signal, and may be an NMOS transistor.

In an embodiment, the first light emission control transistor may include a gate electrode for receiving a light emission control signal and may be configured to turn on upon receiving the light emission control signal to determine a timing of flow of a driving current to the organic light-emitting diode, and may be a PMOS transistor. In an embodiment, the driving transistor may be connected to the switching transistor and the first light emission control transistor and may provide the driving current to the organic light-emitting diode.

In an embodiment, the first light emission control transistor may be configured to turn on during a light emission period of the light emission control signal having a low level.

In an embodiment, the driving transistor may be a PMOS transistor.

In an embodiment, the organic light-emitting display apparatus may further include a second light emission control transistor including a gate electrode for receiving the light emission control signal, a source electrode connected to the driving transistor, and a drain electrode connected to the anode of the organic light-emitting diode, and may be configured to turn on upon receiving the light emission control signal to determine, together with the first light emission control transistor, the timing of flow of the driving current to the organic light-emitting diode, and may be a PMOS transistor.

In an embodiment, the first light emission control transistor may further include a source electrode for receiving a power supply voltage and a drain electrode connected to the driving transistor.

In an embodiment, each of the driving transistor, the first light emission control transistor, and the second light emission control transistor may further include a semiconductor active layer having polycrystalline silicon.

In an embodiment, the switching transistor may further include a semiconductor active layer having an oxide semiconductor.

In an embodiment, the oxide semiconductor may include an oxide of metal including zinc (Zn), indium (In), gallium (Ga), tin (Sn), and titanium (Ti) or mixtures of metal including zinc (Zn), indium (In), gallium (Ga), tin (Sn), and titanium (Ti) and oxides thereof.

In an embodiment, the gate electrode of the first light emission control transistor may be disposed on the semiconductor active layer of the first light emission control transistor.

In an embodiment, the first light emission control transistor may further include an auxiliary electrode disposed on the same layer as the gate electrode of the switching transistor and overlapping the gate electrode of the first light emission control transistor.

In an embodiment, the semiconductor active layer of the switching transistor may be disposed on the semiconductor active layer of the first light emission control transistor and the gate electrode of the first light emission control transistor. The gate electrode of the switching transistor may be disposed on the semiconductor active layer of the switching transistor.

In an embodiment, the gate electrode of the switching transistor may be disposed on the semiconductor active layer of the first light emission control transistor and the gate electrode of the first light emission control transistor. The semiconductor active layer of the switching transistor may be disposed on the gate electrode of the switching transistor.

In an embodiment, the organic light-emitting display apparatus may further include a compensating transistor, an initializing transistor, and a bypass transistor.

In an embodiment, the compensating transistor may include a gate electrode connected to the gate electrode of the switching transistor, a source electrode connected to a drain electrode of the driving transistor, and a drain electrode connected to a gate electrode of the driving transistor.

In an embodiment, the initializing transistor may include a gate electrode for receiving an (n−1)th scan signal, a source electrode connected to the gate electrode of the driving transistor, and a drain electrode.

In an embodiment, the bypass transistor may include a source electrode connected to the drain electrode of the second light emission control transistor and a drain electrode connected to the drain electrode of the initializing transistor.

In an embodiment, each of the compensating transistor, the initializing transistor, and the bypass transistor may be an NMOS transistor.

In an embodiment, each of the compensating transistor, the initializing transistor, and the bypass transistor may further include a semiconductor active layer having polycrystalline silicon.

In an embodiment, the first light emission control transistor, the second light emission control transistor, and the driving transistor may have the same layer structure. The switching transistor, the compensating transistor, the initializing transistor, and the bypass transistor may have the same layer structure.

In an embodiment of the inventive concept, an organic light-emitting display apparatus includes an organic light-emitting diode, a switching transistor, a first light emission control transistor, and a driving transistor.

In an embodiment, the organic light-emitting diode may include an anode and a cathode for receiving a reference voltage.

In an embodiment, the switching transistor may include a gate electrode for receiving an nth scan signal, a source electrode for receiving a data signal, and a semiconductor active layer having an oxide semiconductor.

In an embodiment, the first light emission control transistor may include a gate electrode for receiving a light emission control signal and a semiconductor active layer having polycrystalline silicon, and may be configured to turn on upon receiving the light emission control signal to determine a timing of flow of a driving current to the organic light-emitting diode.

In an embodiment, the driving transistor may include a semiconductor active layer having polycrystalline silicon, may be connected to the switching transistor and the first light emission control transistor, and may provide the driving current to the organic light-emitting diode.

In an embodiment, the switching transistor may be an NMOS transistor. Each of the first light emission control transistor and the driving transistor may be a PMOS transistor.

In an embodiment, the first light emission control transistor may be configured to turn on during a light emission period of the light emission control signal having a low level.

In an embodiment, the organic light-emitting display apparatus may further include a second light emission control transistor. The second light emission control transistor may include a gate electrode for receiving the light emission control signal, a source electrode connected to the driving transistor, and a drain electrode connected to the anode of the organic light-emitting diode, may be configured to turn on upon receiving the light emission control signal to determine, together with the first light emission control transistor, the timing of flow of the driving current to the organic light-emitting diode, may include a semiconductor active layer having polycrystalline silicon, and may be a PMOS transistor.

In an embodiment, the first light emission control transistor may further include a source electrode for receiving a power supply voltage and a drain electrode connected to the driving transistor.

In an embodiment of the inventive concept, an organic light-emitting display apparatus includes an organic light-emitting diode, a switching transistor, a driving transistor, a first light emission control transistor, and a second light emission control transistor.

In an embodiment, the organic light-emitting diode may include an anode and a cathode for receiving a reference voltage.

In an embodiment, the switching transistor may include a gate electrode for receiving an nth scan signal having a high level during a programming period and a source electrode for receiving a data signal, and may be configured to turn on during the programming period.

In an embodiment, the driving transistor may be connected to the switching transistor and may provide a driving current to the organic light-emitting diode.

In an embodiment, the first light emission control transistor may include a gate electrode for receiving a light emission control signal having a low level during a light emission period after the programming period, may be connected between a power supply line for receiving a power supply voltage and the driving transistor, and may be configured to turn on during the light emission period.

In an embodiment, the second light emission control transistor may include a gate electrode for receiving the light emission control signal, may be connected between the driving transistor and the organic light-emitting diode, and may be configured to turn on during the light emission period.

In an embodiment, each of the driving transistor, the first light emission control transistor, and the second light emission control transistor may be a PMOS transistor. The switching transistor may be an NMOS transistor.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Exemplary embodiments of the inventive concept will be described below in more detail with reference to the accompanying drawings. The inventive concept may, however, be embodied in different forms and should not be construed as limited to the embodiments set forth herein. Rather, these embodiments are provided to facilitate one of ordinary skill in the art in understanding the inventive concept.

Figure 1:
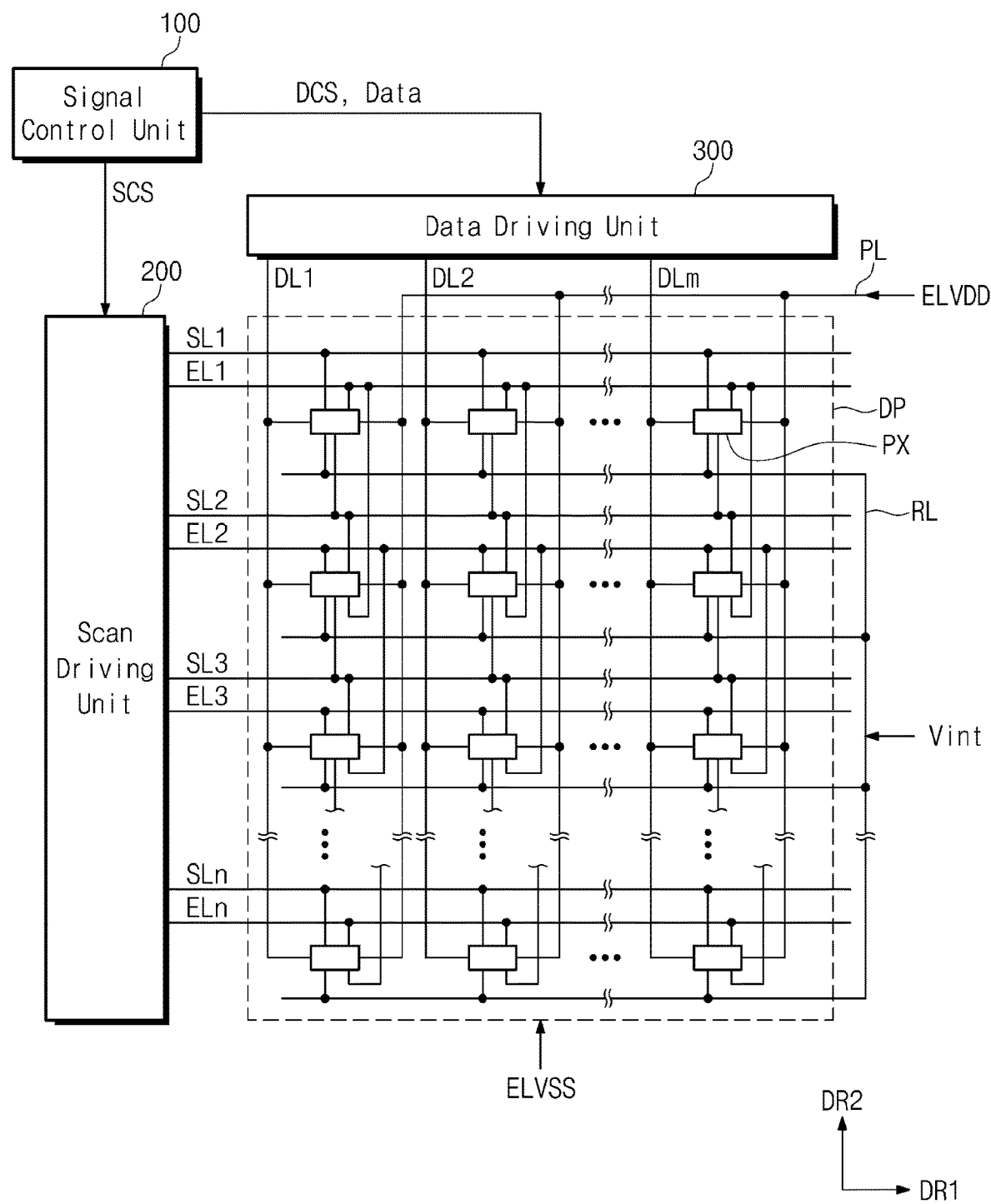
FIG. 1 is a block diagram illustrating an organic light-emitting display apparatus according to an embodiment of the inventive concept.

FIG. 1 is a block diagram illustrating an organic light-emitting display apparatus according to an embodiment of the inventive concept. As illustrated in FIG. 1, the organic light-emitting display apparatus includes a signal control unit 100, a scan driving unit 200, a data driving unit 300, and an organic light-emitting display panel DP.

The signal control unit 100 receives input image signals (not shown), and generates image data Data by converting the input image signals into a data format that is compatible with a specification of an interface with the data driving unit 300. The signal control unit 100 outputs the image data Data and various control signals DCS and SCS.

The scan driving unit 200 receives a scan control signal SCS from the signal control unit 100. The scan control signal SCS may include a vertical initiation signal for initiating operation of the scan driving unit 200 and a clock signal for determining output times of signals. The scan driving unit 200 generates a plurality of scan signals, and sequentially outputs the plurality of scan signals to a plurality of scan lines SL1 to SLn that will be described later. Furthermore, the scan driving unit 200 generates a plurality of emission control signals in response to the scan control signal SCS, and outputs the plurality of emission control signals to a plurality of emission lines EL1 to ELn.

Although FIG. 1 illustrates the plurality of scan signals and the plurality of emission control signals as being output from one scan driving unit 200, an embodiment of the inventive concept is not limited thereto. In an embodiment of the inventive concept, a plurality of scan driving units may separately output the plurality of scan signals, and may separately output the plurality of emission control signals. Furthermore, in an embodiment of the inventive concept, a driving circuit for generating and outputting the plurality of scan signals may be separate from a driving circuit for generating and outputting the plurality of emission control signals.

The data driving unit 300 receives a data control signal DCS and the image data Data from the signal control unit 100. The data driving unit 300 converts the image data Data into data signals, and outputs the data signals to a plurality of data lines DL1 to DLm, which will be described later. The data signals are analog voltages corresponding to gradation values of the image data Data.

The organic light-emitting display panel DP includes the plurality of scan lines SL1 to SLn, the plurality of emission lines EL1 to ELn, the plurality of data lines DL1 to DLm, and a plurality of pixels PX. The plurality of scan lines SL1 to SLn extend in a first direction DR1 and are arranged in a second direction DR2 perpendicular to the first direction. Each of the plurality of emission lines EL1 to ELn may be arranged in parallel with a corresponding scan line among the plurality of scan lines SL1 to SLn. The plurality of data lines DL1 to DLm insulatively intersect the plurality of scan lines SL1 to SLn.

Each pixel PX is connected to a corresponding scan line among the plurality of scan lines SL1 to SLn, a corresponding emission line among the plurality of emission lines EL1 to ELn, and a corresponding data line among the plurality of data lines DL1 to DLm. Each pixel PX receives a power supply voltage ELVDD and a reference voltage ELVSS lower than the power supply voltage ELVDD. Each pixel PX is connected to a power supply line PL to which the power supply voltage ELVDD is applied. Each pixel PX is connected to an initialization line RL, which receives an initialization voltage Vint.

Each pixel PX may be electrically connected to two or more scan lines. FIG. 1 exemplarily illustrates that one pixel PX is connected to three scan lines. For example, pixels PX connected to the second scan line SL2 (hereinafter referred to as pixels of a second pixel row) may also be connected to the first scan line SL1 and the third scan line SL3. The pixels PX of the second pixel row receive a scan signal applied to the first scan line SL1, a scan signal applied to the second scan line SL2, and a scan signal applied to the third scan line SL3. However, an embodiment of the inventive concept is not limited thereto. For example, the pixels PX of the second pixel row may be connected to the first scan line SL1 and the second scan line SL2 but not the third scan line SL3.

Although not illustrated, a plurality of dummy scan lines and a plurality of initialization control lines may be further included in the organic light-emitting display panel DP. The dummy scan lines and the initialization control lines may receive signals applied to the scan lines SL1 to SLn. The dummy scan lines and the initialization control lines may be electrically connected to each other. Each dummy scan line and each initialization control line may be electrically connected to one of corresponding scan lines SL1 to SLn.

Each pixel PX includes an organic light-emitting diode (not shown) and a circuit unit (not shown) for controlling light emission of the organic light-emitting diode. The circuit unit may include a plurality of thin-film transistors (hereinafter referred to as transistors) and a storage capacitor. The pixels PX may include red pixels for emitting red light, green pixels for emitting green light, and blue pixels for emitting blue light. An organic light-emitting diode of a red pixel, an organic light-emitting diode of a green pixel, and an organic light-emitting diode of a blue pixel may include organic light-emitting layers of different materials.

The plurality of scan lines SL1 to SLn, the plurality of emission lines EL1 to ELn, the plurality of data lines DL1 to DLm, the power supply line PL, the initialization line RL, and the plurality of pixels PX may be formed on a base substrate (not shown) through a photolithography process performed multiple times. A plurality of insulating layers may be formed on the base substrate (not shown) through a deposition process or a coating process performed multiple times. The insulating layers include an organic film and/or an inorganic film. In addition, an encapsulating layer (not shown) for protecting the pixels PX may be further formed on the base substrate.

Figure 2:
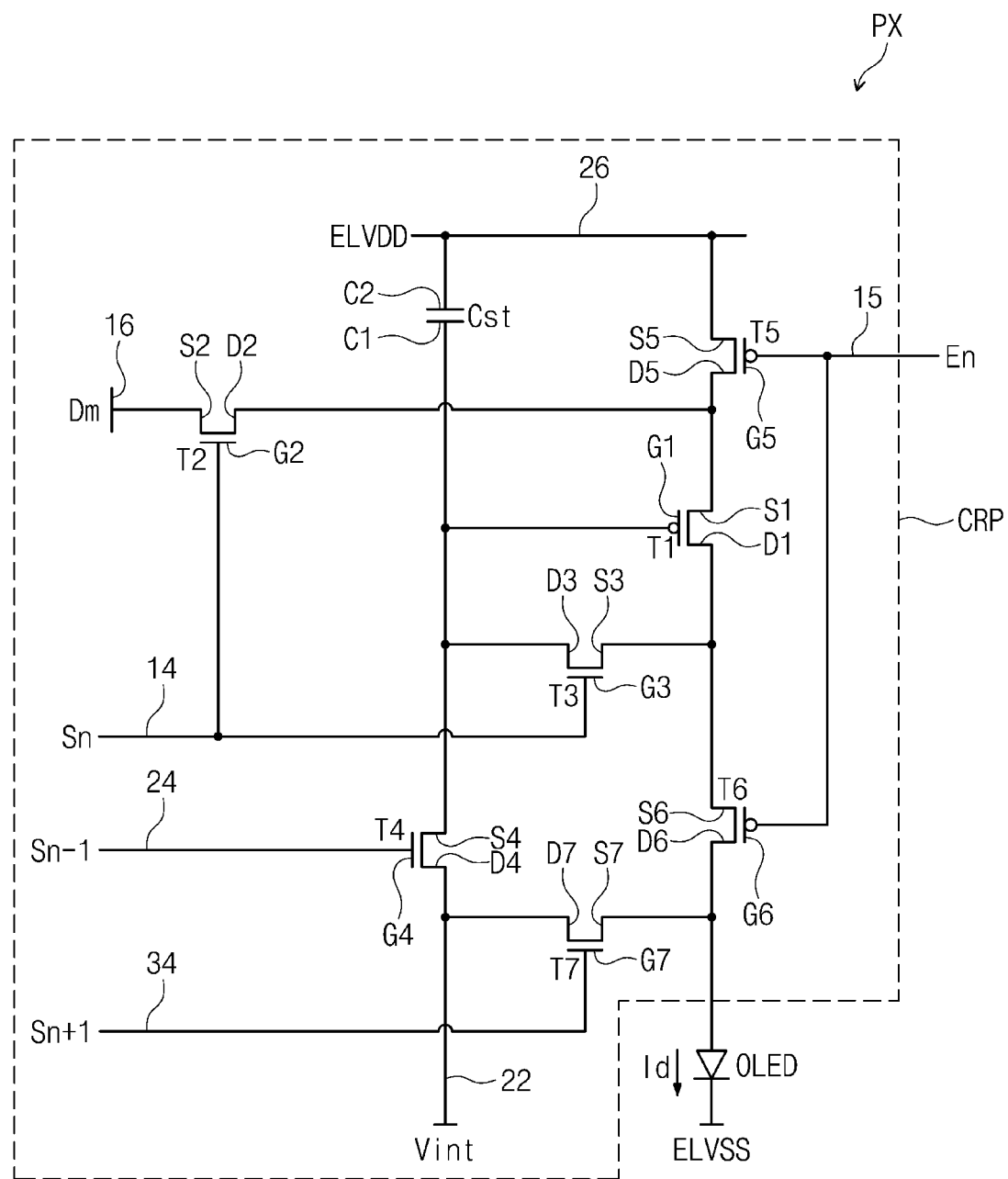
FIG. 2 is an equivalent circuit diagram of a single pixel according to an embodiment of the inventive concept.

FIG. 2 is an equivalent circuit diagram of a single pixel according to an embodiment of the inventive concept.

A circuit unit CRP of one pixel PX according to an embodiment of the inventive concept includes a plurality of transistors T1 to T7 and a storage capacitor Cst. The pixel PX may include an organic light-emitting diode OLED which receives a driving current Id from the circuit unit CRP to emit light.

Thin-film transistors T1 to T7 include a driving transistor T1, a switching transistor T2, a compensating transistor T3, an initializing transistor T4, a first light emission control transistor T5, a second light emission control transistor T6, and a bypass transistor T7.

The pixel PX includes a first scan line 14 for transferring an nth scan signal Sn to the switching transistor T2 and the compensating transistor T3, a second scan line 24 for transferring an (n−1)th scan signal Sn−1 to the initializing transistor T4, a third scan line 34 for transferring an (n+1)th scan signal Sn+1 to the bypass transistor T7, a light emission line 15 for transferring a light emission control signal En to the first light emission control transistor T5 and the second light emission control transistor T6, a data line 16 for transferring a data signal Dm, a power supply line 26 for transferring the power supply voltage ELVDD, and an initialization line 22 for transferring the initialization voltage Vint for initializing the driving transistor T1.

A gate electrode G1 of the driving transistor T1 is connected to a first electrode C1 of the storage capacitor Cst.

A source electrode S1 of the driving transistor T1 is connected to the power supply line 26 via the first light emission control transistor T5. A drain electrode D1 of the driving transistor T1 is electrically connected to an anode of the organic light-emitting diode OLED via the second light emission control transistor T6. The driving transistor T1 receives the data signal Dm according to a switching operation of the switching transistor T2 and supplies the driving current Id to the organic light-emitting diode OLED.

A gate electrode G2 of the switching transistor T2 is connected to the first scan line 14. A source electrode S2 of the switching transistor T2 is connected to the data line 16. A drain electrode D2 of the switching transistor T2 is connected to the source electrode S1 of the driving transistor T1 and is connected to the power supply line 26 via the first light emission control transistor T5. The switching transistor T2 is turned on in response to the nth scan signal Sn received through the first scan line 14 to perform a switching operation for transferring, to the source electrode S1 of the driving transistor T1, the data signal Dm transferred to the data line 16.

A gate electrode G3 of the compensating transistor T3 is connected to the first scan line 14. A source electrode S3 of the compensating transistor T3 is connected to the drain electrode D1 of the driving transistor T1, and is connected to the anode of the organic light-emitting diode OLED via the second light emission control transistor T6. A drain electrode D3 of the compensating transistor T3 is connected to the first electrode C1 of the storage capacitor Cst, a source electrode S4 of the initializing transistor T4, and the gate electrode G1 of the driving transistor T1. The compensating transistor T3 is turned on in response to the nth scan signal Sn received through the first scan line 14 to connect the gate electrode G1 and the drain electrode D1 of the driving transistor T1 to each other so that the driving transistor T1 is diode-connected.

A gate electrode G4 of the initializing transistor T4 is connected to the second scan line 24. A drain electrode D4 of the initializing transistor T4 is connected to the initialization line 22. The source electrode S4 of the initializing transistor T4 is connected to the first electrode C1 of the storage capacitor Cst, the drain electrode D3 of the compensating transistor T3, and the gate electrode G1 of the driving transistor T1. The initializing transistor T4 is turned on in response to the (n−1)th scan signal received through the second scan line 24 to transfer the initialization voltage Vint to the gate electrode G1 of the driving transistor T1 so that a voltage of the gate electrode G1 of the driving transistor T1 is initialized.

A gate electrode G5 of the first light emission control transistor T5 is connected to the light emission line 15. The first light emission control transistor T5 may be connected between the power supply line 26 and the driving transistor T1. A source electrode S5 of the first light emission control transistor T5 is connected to the power supply line 26. A drain electrode D5 of the first light emission control transistor T5 is connected to the source electrode S1 of the driving transistor T1 and the drain electrode D2 of the switching transistor T2. Since the light emission control signal En is applied to the gate electrode G5 of the first light emission control transistor T5, the first light emission control transistor T5 is turned on so that the driving current Id flows through the organic light-emitting diode OLED. The first light emission control transistor T5 may determine a timing of flow of the driving current Id to the organic light-emitting diode OLED.

A gate electrode G6 of the second light emission control transistor T6 is connected to the light emission line 15. The second light emission control transistor T6 may be connected between the driving transistor T1 and the organic light-emitting diode OLED. A source electrode S6 of the second light emission control transistor T6 is connected to the drain electrode D1 of the driving transistor T1 and the source electrode S3 of the compensating transistor T3. A drain electrode D6 of the second light emission control transistor T6 is electrically connected to the anode of the organic light-emitting diode OLED. The first light emission control transistor T5 and the second light emission control transistor T6 are turned on in response to the light emission control signal En received through the light emission line 15. Since the light emission control signal En is applied to the gate electrode G6 of the second light emission control transistor T6, the second light emission control transistor T6 is turned on so that the driving current Id flows through the organic light-emitting diode OLED. The second light emission control transistor T6 may determine the timing of the flow of the driving current Id to the organic light-emitting diode OLED.

A gate electrode G7 of the bypass transistor T7 is connected to the third scan line 34. A source electrode S7 of the bypass transistor T7 is connected to the anode of the organic light-emitting diode (OLED). A drain electrode D7 of the bypass transistor T7 is connected to the initialization line 22. The bypass transistor T7 is turned on in response to the (n+1)th scan signal Sn+1 received through the third scan line 34, so as to initialize the anode of the organic light-emitting diode OLED.

A second electrode C2 of the storage capacitor Cst is connected to the power supply line 26. The first electrode C1 of the storage capacitor Cst is connected to the gate electrode G1 of the driving transistor T1, the drain electrode D3 of the compensating transistor T3, and the source electrode S4 of the initializing transistor T4.

A cathode of the organic light-emitting diode OLED receives the reference voltage ELVSS. The organic light-emitting diode OLED receives the driving current Id from the driving transistor T1 to emit light.

In an embodiment of the inventive concept, each of the switching transistor T2, the compensating transistor T3, the initializing transistor T4, and the bypass transistor T7 is an n-type metal oxide semiconductor (NMOS) transistor. Therefore, the switching transistor T2, the compensating transistor T3, the initializing transistor T4, and the bypass transistor T7 are turned on by positive (+) charge applied to the gate electrodes thereof.

As described below, each of the switching transistor T2, the compensating transistor T3, the initializing transistor T4, and the bypass transistor T7 uses an oxide semiconductor as a channel region. According to a process for forming a transistor that has an oxide semiconductor as a channel layer, each of the switching transistor T2, the compensating transistor T3, the initializing transistor T4, and the bypass transistor T7 is formed as an NMOS transistor.

In an embodiment of the inventive concept, each of the driving transistor T1, the first light emission control transistor T5, and the second light emission control transistor T6 is a p-type metal oxide semiconductor (PMOS) transistor. Therefore, the driving transistor T1, the first light emission control transistor T5, and the second light emission control transistor T6 are turned on by negative (−) charge applied to the gate electrodes thereof.

Figure 3:
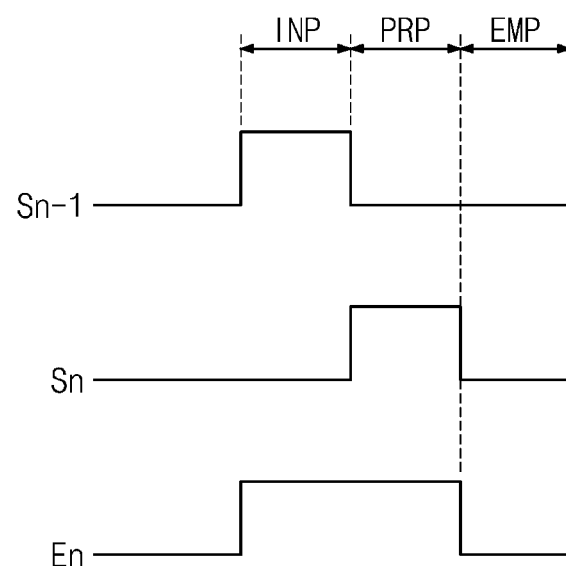
FIG. 3 is a timing diagram of a signal applied to a single pixel of an organic light-emitting display apparatus according to an embodiment of the inventive concept.

FIG. 3 is a timing diagram of a signal applied to a single pixel of an organic light-emitting display apparatus according to an embodiment of the inventive concept.

Referring to FIGS. 2 and 3, the (n−1)th scan signal Sn−1 is supplied through the second scan line 24 during an initialization period INP. The (n−1)th scan signal Sn−1 has a high level during the initialization period INP, which would turn on an NMOS transistor. Since the initializing transistor T4 is an NMOS transistor, the initializing transistor T4 is turned on in response to the (n−1)th scan signal Sn−1 having a high level. The initialization voltage Vint is applied from the initialization line 22 to the gate electrode G1 of the driving transistor T1 via the initializing transistor T4, and the driving transistor T1 is initialized by the initialization voltage Vint.

Thereafter, the nth scan signal Sn is supplied through the first scan line 14 during a programming period PRP. The nth scan signal Sn has a high level during the programming period PRP, which would turn on an NMOS transistor. Since the switching transistor T2 and the compensating transistor T3 are NMOS transistors, the switching transistor T2 and the compensating transistor T3 are turned on in response to the nth scan signal Sn. The driving transistor T1 is diode-connected by the compensating transistor T3 turned on, and is forward biased.

During the programming period PRP, a compensation voltage (Dm+Vth, where Vth has a negative (−) value) is applied to the gate electrode G1 of the driving transistor T1. That is, the compensation voltage is reduced from the data signal Dm supplied from the data line 16 by as much as a threshold voltage Vth of the driving transistor T1. The power supply voltage ELVDD and the compensation voltage Dm+Vth are applied to both terminals of the storage capacitor Cst respectively, and the storage capacitor Cst stores a quantity of charge corresponding to a difference between voltages of both the terminals.

Thereafter, during a light emission period EMP, the light emission control signal En is supplied through the light emission line 15. The light emission control signal En has a low level during the light emission period EMP, which would turn on a PMOS transistor. Since the first light emission control transistor T5 and the second light emission control transistor T6 are PMOS transistors, the first light emission control transistor T5 and the second light emission control transistor T6 are PMOS transistors are turned on in response to the light emission control signal En having a low level.

During the light emission period EMP, the driving current Id is generated in the driving transistor T1 according to a voltage difference between a gate voltage of the gate electrode G1 and the power supply voltage ELVDD, and the driving current Id is supplied to the organic light-emitting diode OLED via the second light emission control transistor T6. During the light emission period EMP, a gate-source voltage Vgs of the driving transistor T1 is maintained as (Dm+Vth)−ELVDD by the storage capacitor Cst. According to a current-voltage relation of the driving transistor T1, the driving current Id is proportional to a square of a value obtained by subtracting the threshold voltage from the source-gate voltage (i.e., $(Dm-ELVDD)^2$). That is, the driving current Id is determined regardless of the threshold voltage Vth of the driving transistor T1.

If the organic light-emitting diode OLED emits light even when a minimum current of the driving transistor T1 for displaying a black image flows as the driving current, the black image is not accurately displayed. That is, the smaller the voltage difference between the anode and the cathode of the organic light-emitting diode OLED the more accurate the black image, and the larger the voltage difference between the anode and the cathode of the organic light-emitting diode OLED, the less accurate the black image.

The anode of the organic light-emitting diode OLED occupies a relatively large area within the pixel PX, and partially overlaps the transistors T1 to T7. Accordingly, the anode of the organic light-emitting diode OLED and the electrodes of the transistors T1 to T7 form a capacitor. Due to voltages applied to the electrodes of the transistors T1 to T7, a voltage level of the anode of the organic light-emitting diode OLED may change (i.e., a capacitor coupling phenomenon may occur).

As a comparative example, it is assumed that the first light emission control transistor T5 and the second light emission control transistor T6 are NMOS transistors, and the light emission control signal has a high level during the light emission period EMP. In the case of the comparative example, the voltage level of the anode of the organic light-emitting diode OLED may increase due to a high-level light emission control signal applied to the gate electrode G5 of the first light emission control transistor T5 and the gate electrode G6 of the second light emission control transistor T6 during the light emission period EMP. When an image to be displayed during the light emission period EMP is a black image, the black image may not be accurately displayed due to the increase of the anode voltage of the organic light-emitting diode OLED caused by the coupling phenomenon.

In the organic light-emitting display apparatus according to an embodiment of the inventive concept, some of the transistors T1 to T7 included in the pixel PX are formed as PMOS transistors containing polysilicon, and thus may have relatively high mobility and reliability. Furthermore, the other transistors are formed as NMOS transistors containing an oxide semiconductor, and thus may have a relatively low leakage current and may improve power consumption.

Furthermore, in an embodiment of the inventive concept, the first and second light emission control transistors T5 and T6 are formed as PMOS transistors containing polysilicon, and the light emission control signal En has a low level during the light emission period EMP. Therefore, the organic light-emitting display apparatus according to an embodiment of the inventive concept may prevent the voltage level of the anode of the organic light-emitting diode OLED from increasing during the light emission period EMP, and, particularly, may accurately display a low gray-scale image (e.g., a black image).

Referring back to FIG. 2, the driving transistor T1 and the second light emission control transistor T6 have substantially the same layer structure as the first light emission control transistor T5. Furthermore, the compensating transistor T3, the initializing transistor T4, and the bypass transistor T7 have substantially the same layer structure as the switching transistor T2.

In detail, the gate electrodes of the driving transistor T1, the first light emission control transistor T5, and the second light emission control transistor T6 are arranged on the same layer, the source electrodes and the drain electrodes are arranged on the same layer, and semiconductor active layers are arranged on the same layer.

Likewise, the gate electrodes of the switching transistor T2, the compensating transistor T3, the initializing transistor T4, and the bypass transistor T7 are arranged on the same layer, the source electrodes and the drain electrodes are arranged on the same layer, and semiconductor active layers are arranged on the same layer.

For convenience, the following figures do not illustrate structures of the transistors within the pixel PX except for the switching transistor T2 and the first light emission control transistor T5, i.e., do not illustrate structures of the driving transistor T1, the compensating transistor T3, the initializing transistor T4, the second light emission control transistor T6, and the bypass transistor T7.

Figure 4:
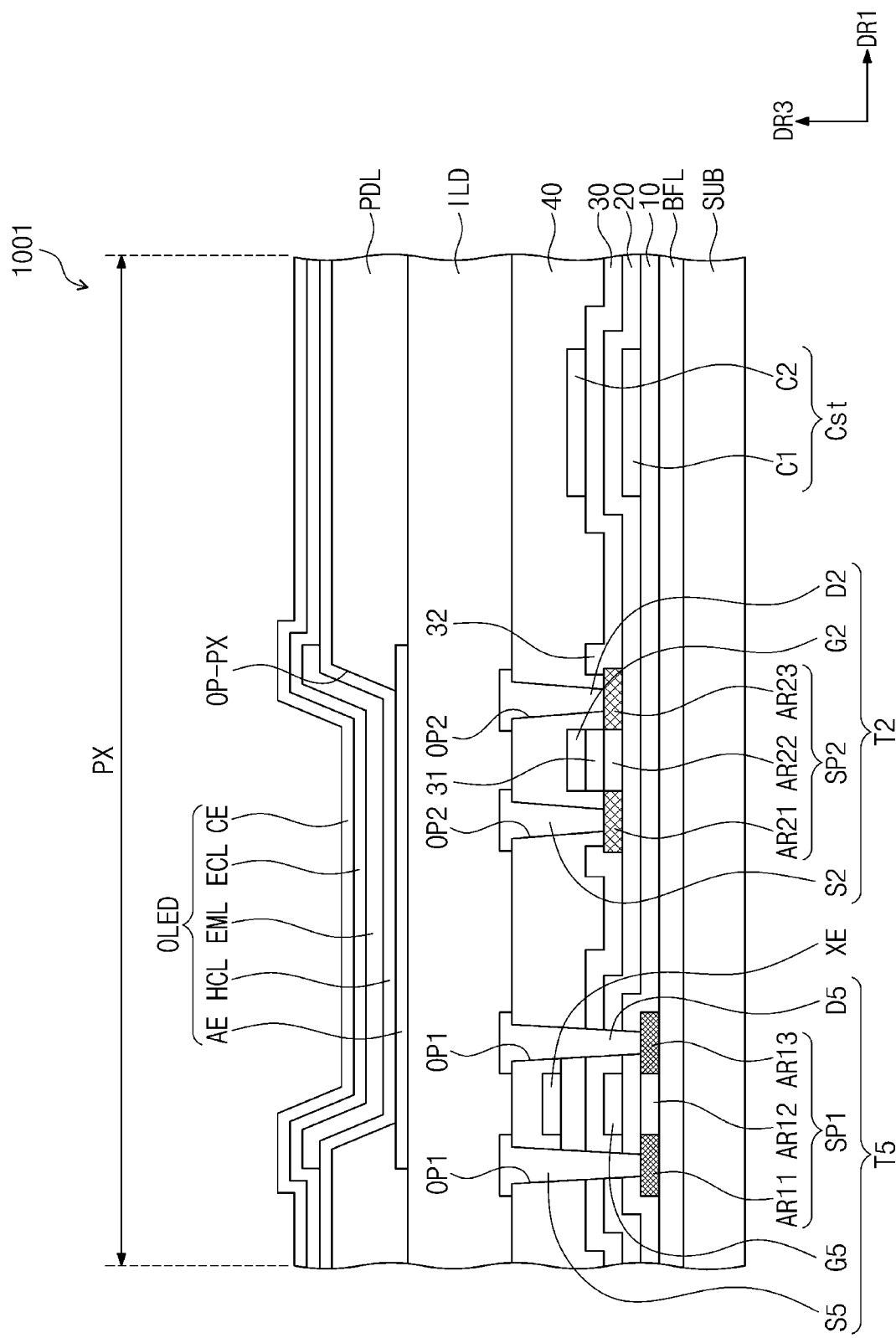
FIG. 4 is a partial cross-sectional view of an organic light-emitting display apparatus corresponding to the pixel of FIG. 2 according to an embodiment of the inventive concept.

FIG. 4 is a partial cross-sectional view of an organic light-emitting display apparatus 1001 corresponding to the pixel PX of FIG. 2 according to an embodiment of the inventive concept.

FIG. 4 exemplarily illustrates the first light emission control transistor T5 and the switching transistor T2 among the seven transistors of the pixel PX.

The first light emission control transistor T5, the switching transistor T2, the storage capacitor Cst, and the organic light-emitting diode OLED are arranged on a base substrate SUB.

The first light emission control transistor T5 includes the source electrode S5, the drain electrode D5, the gate electrode G5, and a first semiconductor pattern SP1. The switching transistor T2 includes the source electrode S2, the drain electrode D2, the gate electrode G2, and a second semiconductor pattern SP2. The pixel PX may further include an auxiliary electrode XE.

The first electrode C1 and the second electrode C2 of the storage capacitor Cst are spaced apart from each other with a predetermined insulating film therebetween.

The organic light-emitting diode OLED includes an anode AE, a first charge control layer HCL, an emission layer EML, a second charge control layer ECL, and a cathode CE. In the present embodiment, the first charge control layer HCL, the emission layer EML, and the second charge control layer ECL may respectively correspond to a hole control layer HCL, an emission layer EML, and an electron control layer ECL. However, this structure is merely an example, and cross-sectional positions of the anode AE and the cathode CE may be switched with each other.

The base substrate SUB may be a layer, a film, or a plate on which the first light emission control transistor T5, the switching transistor T2, and the storage capacitor Cst may be arranged. The base substrate SUB may include a plastic substrate, a glass substrate, a metal substrate, etc. The plastic substrate may include at least one of acrylic resin, methacrylic resin, polyisoprene, vinyl-based resin, epoxy-based resin, urethane-based resin, cellulosic resin, siloxane resin, polyimide-based resin, polyamide-based resin, or perylene-based resin.

A buffer layer BFL may be disposed between an upper surface of the base substrate SUB and the first light emission control transistor T5 and switching transistor T2. The buffer layer BFL improves a bond strength between the base substrate SUB and conductive patterns or semiconductor patterns. The buffer layer BFL may include an inorganic material and/or an organic material. Although not illustrated, a barrier layer may be disposed on the base substrate SUB to prevent infiltration of foreign substances. The buffer layer BFL and the barrier layer may be optionally disposed or omitted.

The first semiconductor pattern SP1 is disposed on the buffer layer BFL. The first semiconductor pattern SP1 may include a crystalline semiconductor material. For example, the first semiconductor pattern SP1 may include a polycrystalline semiconductor material such as polycrystalline silicon.

The first semiconductor pattern SP1 may be divided into a first region AR11 and a third region AR13 containing impurities and a second region AR12 disposed between the first region AR11 and the third region AR13. The impurities may be a dopant. The first region AR11 is connected to the source electrode S5 of the first light emission control transistor T5, and the third region AR13 is connected to the drain electrode D5 of the first light emission control transistor T5.

The second region AR12 is disposed between the first region AR11 and the third region AR13, and may overlap the gate electrode G5 of the first light emission control transistor T5 in a plane view. The second region AR12 may be a channel region of the first light emission control transistor T5.

The channel region of the first light emission control transistor T5 may include a polycrystalline semiconductor material. Accordingly, the first light emission control transistor T5 may operate as a driving element having improved mobility and high reliability.

A first insulating layer 10 is disposed on the first semiconductor pattern SP1. The first insulating layer 10 may include at least one of an inorganic material or an organic material. For example, the first insulating layer 10 may include a silicon nitride and/or a silicon oxide.

The first insulating layer 10 may be disposed on the buffer layer BFL to cover at least a part of the first semiconductor pattern SP1. However, this illustration is merely an example, and the first insulating layer 10 may be an insulating pattern overlapping the second region AR12 in a plane view. The first insulating layer 10 according to an embodiment of the inventive concept may have various shapes, and is not limited to a specific embodiment.

The gate electrode G5 of the first light emission control transistor T5 and the first electrode C1 of the storage capacitor Cst are arranged on the first insulating layer 10. The gate electrode G5 of the first light emission control transistor T5 and the first electrode C1 of the storage capacitor Cst may be arranged on the same layer.

The gate electrode G5 of the first light emission control transistor T5 overlaps the second region AR12 of the first semiconductor pattern SP1. The gate electrode G5 of the first light emission control transistor T5 may have the same shape as the second region AR12 of the first semiconductor pattern SP1 in a plane view.

A second insulating layer 20 is disposed on the gate electrode G5 of the first light emission control transistor T5 and the first electrode C1 of the storage capacitor Cst. The second insulating layer 20 is disposed on the first insulating layer 10 to cover the gate electrode G5 of the first light emission control transistor T5 and the first electrode C1 of the storage capacitor Cst. The second insulating layer 20 may include an organic material and/or an inorganic material. In an organic light-emitting display apparatus according to an embodiment of the inventive concept, the second insulating layer 20 may not be provided.

The second semiconductor pattern SP2 is disposed on the second insulating layer 20. The second semiconductor pattern SP2 may include an oxide semiconductor. For example, the oxide semiconductor may include an oxide of metal such as zinc (Zn), indium (In), gallium (Ga), tin (Sn), and titanium (Ti) or mixtures of metal such as zinc (Zn), indium (In), gallium (Ga), tin (Sn), and titanium (T1) and oxides thereof.

The second semiconductor pattern SP2 may be divided into a first region AR21 and a third region AR23 containing impurities and a second region AR22 disposed between the first region AR21 and the third region AR23. The first region AR21 and the third region AR23 are spaced apart from each other with the second region AR22 therebetween.

The second region AR22 may be a channel region of the switching transistor T2. In the second semiconductor pattern SP2, the impurities may be reduced metal materials. The first region AR21 and the third region AR23 may include metal materials reduced from a metal oxide included in the second region AR22. Accordingly, the switching transistor T2 may reduce a leakage current, and may operate as a switching element having improved ON-OFF characteristics.

A third insulating layer 30 is disposed on the second insulating layer 20. The third insulating layer 30 includes an inorganic material and/or an organic material. The third insulating layer 30 overlaps the gate electrode G5 of the first light emission control transistor T5 and the first electrode C1 of the storage capacitor Cst, and exposes at least a part of the second semiconductor pattern SP2. The third insulating layer 30 includes a first insulating pattern 31, which covers the second region AR22 of the second semiconductor pattern SP2, and a second insulating pattern 32, which exposes at least a part of the first and second regions AR21 and AR23. The first insulating pattern 31 and the second insulating pattern 32 may be formed by forming openings that respectively expose the first region AR21 and the third region AR23.

The gate electrode G2 of the switching transistor T2, the auxiliary electrode XE, and the second electrode C2 of the storage capacitor Cst are arranged on the third insulating layer 30. The gate electrode G2 of the switching transistor T2 is disposed on the first insulating pattern 31. Although not illustrated, the scan lines SL1 to SLn (see FIG. 1) may be arranged on the same layer as the gate electrode G2 of the switching transistor T2.

The second electrode C2 of the storage capacitor Cst is disposed to overlap the first electrode C1.

The gate electrode G2 of the switching transistor T2, the auxiliary electrode XE, and the second electrode C2 of the storage capacitor Cst may be arranged on the same layer. Furthermore, the gate electrode G2 of the switching transistor T2, the auxiliary electrode XE, and the second electrode C2 of the storage capacitor Cst may include the same material.

The auxiliary electrode XE is disposed to overlap the gate electrode G5 of the first light emission control transistor T5. The auxiliary electrode XE may form, together with the gate electrode G5 of the first light emission control transistor T5, a capacitor, and the formed capacitor may be connected in parallel to the storage capacitor Cst.

A fourth insulating layer 40 is disposed on the gate electrode G2 of the switching transistor T2, the auxiliary electrode XE, and the second electrode C2 of the storage capacitor Cst. The fourth insulating layer 40 includes an inorganic material and/or an organic material.

The source electrode S5 and the drain electrode D5 of the first light emission control transistor T5 and the source electrode S2 and the drain electrode D2 of the switching transistor T2 are arranged on the fourth insulating layer 40. The source electrode S5 and the drain electrode D5 of the first light emission control transistor T5 and the source electrode S2 and the drain electrode D2 of the switching transistor T2 may pass through at least a part of the first to fourth insulating layers 10 to 40 so as to be connected to the first semiconductor pattern SP1 or the second semiconductor pattern SP2.

In detail, the source electrode S5 and the drain electrode D5 of the first light emission control transistor T5 are respectively connected to the first region AR11 and the third region AR13 of the first semiconductor pattern SP1 via first through-holes OP1 passing through the first to fourth insulating layers 10 to 40. The source electrode S2 and the drain electrode D2 of the switching transistor T2 are respectively connected to the first region AR21 and the third region AR23 of the second semiconductor pattern SP2 via second through-holes OP2 passing through the fourth insulating layer 40. Although not illustrated, the data lines DL1 to DLm may be arranged on the same layer as the source electrodes S2 and S5 and the drain electrodes D2 and D5. Accordingly, the data lines DL1 to DLm may be directly arranged on an upper surface of the fourth insulating layer 40.

An intermediate film ILD is disposed on the fourth insulating layer 40. The intermediate film ILD includes an inorganic material and/or an organic material. A third through-hole passing through the intermediate film ILD may be defined in the intermediate film ILD. The third through-hole may be defined in a region overlapping a first output electrode OE1 (not shown).

The anode AE is disposed on the intermediate film ILD. A pixel defining film PDL is disposed on the intermediate film ILD. The pixel defining film PDL may include an inorganic film and/or an organic film. A predetermined opening OP-PX is defined in the pixel defining film PDL. The OP-PX exposes at least a part of the anode AE.

The first charge control layer HCL, the emission layer EML, the second charge control layer ECL, and the cathode CE are sequentially stacked on the anode AE. The emission layer EML may be a light emission pattern overlapping the opening OP-PX. The organic light-emitting diode OLED generates light from the emission layer EML by using a voltage difference between the anode AE and the cathode CE.

Although not illustrated, a display apparatus according to an embodiment of the inventive concept may further include an organic film and/or an inorganic film disposed on the cathode CE.

A transistor using an oxide semiconductor as a channel region may reduce a leakage current, and may operate as a switching element having improved ON-OFF characteristics. According to the organic light-emitting display apparatus 1001 according to an embodiment of the inventive concept, power consumption may be improved by configuring the channel regions of the switching transistor T2, the compensating transistor T3, the initializing transistor T4, and the bypass transistor T7, among the plurality of transistors T1 to T7 (see FIG. 2) of one pixel PX, by using oxide semiconductors. A transistor having an oxide semiconductor as a channel region operates as an NMOS transistor.

A transistor using polycrystalline silicon as a channel region may operate as a switching element having relatively high mobility and high reliability. According to the organic light-emitting display apparatus 1001 according to an embodiment of the inventive concept, the first and second light emission control transistors T5 and T6 are formed as PMOS transistors, and may thus have improved mobility and may secure high reliability.

Furthermore, the anode voltage level of the organic light-emitting diode OLED may be prevented from increasing by applying the light emission control signal En (see FIG. 3) to the first and second light emission control transistors T5 and T6 during the light emission period EMP (see FIG. 3). Therefore, the organic light-emitting display apparatus 1001 may accurately display a black image.

Figure 5:
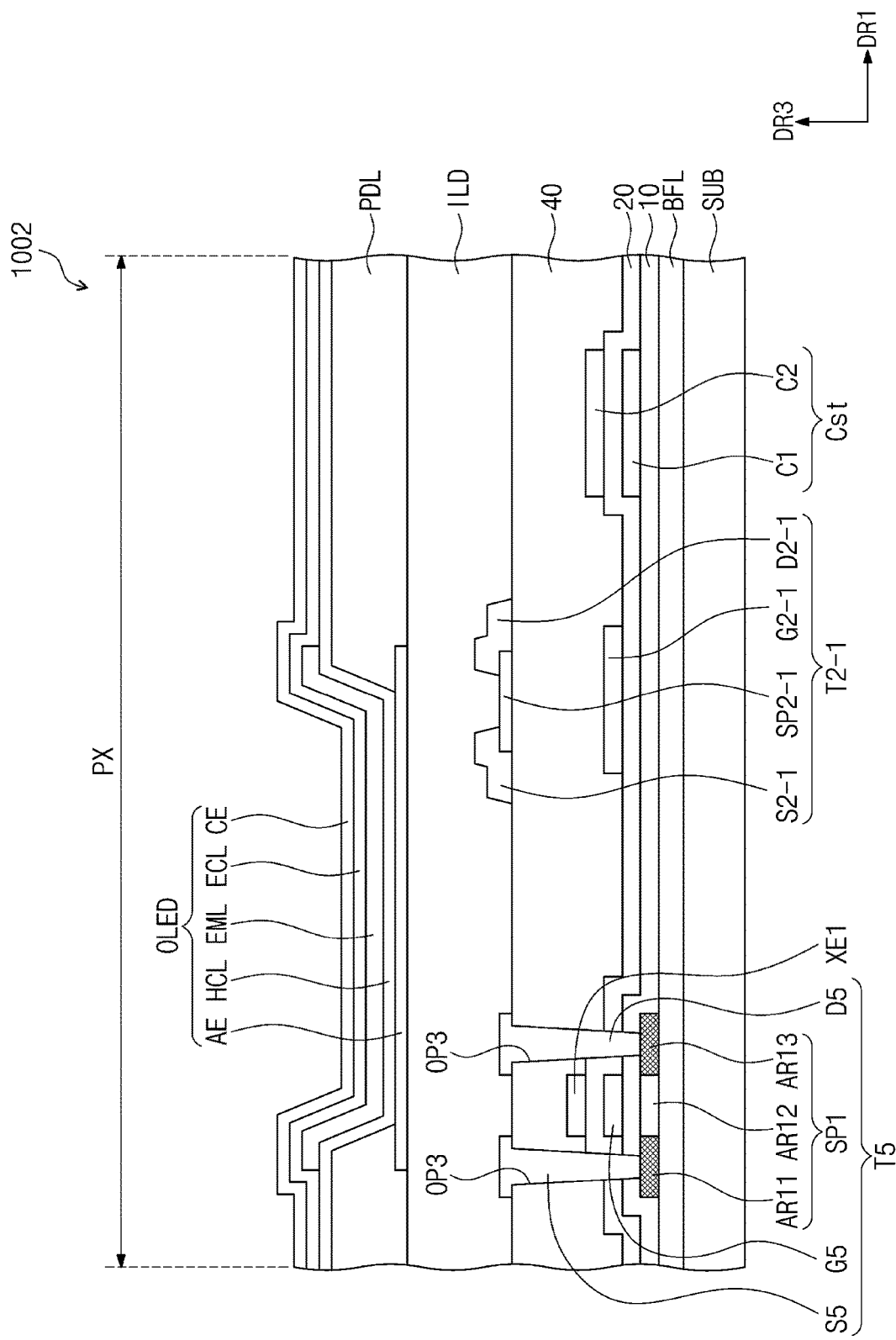
FIG. 5 is a partial cross-sectional view of an organic light-emitting display apparatus corresponding to the pixel of FIG. 2 according to another embodiment of the inventive concept.

FIG. 5 is a partial cross-sectional view of an organic light-emitting display apparatus 1002 corresponding to the pixel PX of FIG. 2 according to another embodiment of the inventive concept. The switching transistor T2 of the organic light-emitting display apparatus 1001 described with reference to FIG. 4 is different from a switching transistor T2-1 of the organic light-emitting display apparatus 1002 described below with reference to FIG. 5 in that the switching transistor T2 has a top-gate structure, whereas the switching transistor T2-1 has a bottom-gate structure, but the switching transistor T2 and the switching transistor T2-1 are substantially the same with respect to other points.

FIG. 5 exemplarily illustrates the first light emission control transistor T5 and the switching transistor T2-1 among the seven transistors of the pixel PX. In another embodiment of the inventive concept, the driving transistor T1, the first light emission control transistor T5, and the second light emission control transistor T6 may have the same layer structure, and the switching transistor T2-1, the compensating transistor T3, the initializing transistor T4, and the bypass transistor T7 may have the same layer structure.

The switching transistor T2-1 may include a gate electrode G2-1 disposed on the second insulating layer 20, a second semiconductor pattern SP2-1 disposed on the fourth insulating layer 40, and a source electrode S2-1 and a drain electrode D2-1 arranged on the fourth insulating layer 40. The gate electrode G2-1 may be disposed between the second insulating layer 20 and the fourth insulating layer 40. The gate electrode G2-1 may be disposed on the same layer as the auxiliary electrode XE1 and the second electrode C2 of the storage capacitor Cst.

The second semiconductor pattern SP2-1 may be disposed on the gate electrode G2-1. The second semiconductor pattern SP2-1 overlaps the gate electrode G2-1 in a plane view. The source electrode S2-1 and the drain electrode D2-1 are arranged on the fourth insulating layer 40 so as to partially cover the second semiconductor pattern SP2-1. Although not illustrated, the switching transistor T2-1 may further include an ohmic contact layer defined in a region of the second semiconductor pattern SP2-1, which contacts the source electrode S2-1 and the drain electrode D2-1.

The first light emission control transistor T5 includes the first semiconductor pattern SP1 disposed on the buffer layer BFL, the gate electrode G5 disposed on the first insulating layer 10, and the source electrode S5 and the drain electrode D5 arranged on the fourth insulating layer 40. The source electrode S5 and the drain electrode D5 of the first light emission control transistor T5 may be respectively connected to the first region AR11 and the third region AR13 of the first semiconductor pattern SP1 via openings OP3 passing through the first insulating layer 10, the second insulating layer 20, and the fourth insulating layer 40. The pixel PX may further include an auxiliary electrode XE1 disposed on the second insulating layer 20.

In the organic light-emitting display apparatus 1002 of FIG. 5, the gate electrode G2-1 of the switching transistor T2-1 and the second semiconductor pattern SP2-1 are insulated by the fourth insulating layer 40. Therefore, unlike the organic light-emitting display apparatus 1001 of FIG. 4, the organic light-emitting display apparatus 1002 of FIG. 5 may not be provided with the third insulating layer 30.

In an organic light-emitting display apparatus according to an embodiment of the inventive concept, some of the transistors included in a pixel are formed as PMOS transistors containing polysilicon, and thus may have relatively high mobility and reliability. Furthermore, the other transistors are formed as NMOS transistors containing an oxide semiconductor, and thus may have a relatively low leakage current and may improve power consumption.

The organic light-emitting display apparatus according to an embodiment of the inventive concept may prevent the voltage level of the anode of an organic light-emitting diode from increasing during the light emission period, and, particularly, may accurately display a low gray-scale image.

Although the exemplary embodiments of the present invention have been described, it is understood that the present invention are not limited to these exemplary embodiments but various changes and modifications can be made by one ordinary skilled in the art within the spirit and scope of the present invention as hereinafter claimed.

What is claimed is:

1. A light-emitting display apparatus comprising:
    a driving transistor electrically connected between a first node and a second node and including a gate electrode connected to a third node;
    a switching transistor connected between a data line and the first node and including a gate electrode connected to a scan line;
    a first light emission control transistor connected between a first voltage line and the first node and including a gate electrode connected to a light emission control line;
    a light-emitting device including an anode electrically connected to the second node and a cathode; and
    a capacitor including a first electrode connected to the first voltage line and a second electrode connected to the third node,
    wherein the gate electrode of the first light emission control transistor is disposed on a same layer as the first electrode of the capacitor; and
    wherein the first light emission control transistor further includes an auxiliary electrode disposed on a same layer as the second electrode of the capacitor and the gate electrode of the switching transistor.

2. The light-emitting display apparatus of claim 1, wherein each of the driving transistor and the first light emission control transistor is a P-type transistor.

3. The light-emitting display apparatus of claim 1, wherein the switching transistor is an N-type transistor.

4. The light-emitting display apparatus of claim 1, further comprising a second light emission control transistor connected between the second node and the anode of the light-emitting device.

5. The light-emitting display apparatus of claim 4, wherein each of the driving transistor, the first light emission control transistor, and the second light emission control transistor further includes a semiconductor active layer having polycrystalline silicon, and
    wherein the switching transistor further includes a semiconductor active layer having an oxide semiconductor.

6. The light-emitting display apparatus of claim 5, wherein the oxide semiconductor includes an oxide of metal including at least one of zinc (Zn), indium (In), gallium (Ga), tin (Sn), and titanium (Ti) or mixtures of metal including at least one of zinc (Zn), indium (In), gallium (Ga), tin (Sn), and titanium (Ti) and oxides thereof.

7. The light-emitting display apparatus of claim 5, wherein the gate electrode of the first light emission control transistor is disposed on an insulating layer which is disposed on the semiconductor active layer of the first light emission control transistor.

8. The light-emitting display apparatus of claim 5, wherein the scan line is disposed on a same layer as the gate electrode of the switching transistor.

9. The light-emitting display apparatus of claim 5,
    wherein the semiconductor active layer of the switching transistor is disposed on the semiconductor active layer of the first light emission control transistor and the gate electrode of the first light emission control transistor, and wherein the gate electrode of the switching transistor is disposed on the semiconductor active layer of the switching transistor.

10. The light-emitting display apparatus of claim 5, wherein the gate electrode of the switching transistor is disposed on the semiconductor active layer of the first light emission control transistor and the gate electrode of the first light emission control transistor, and wherein the semiconductor active layer of the switching transistor is disposed on the gate electrode of the switching transistor.

11. A light-emitting display apparatus comprising:

a light-emitting device including an anode and a cathode;

a first transistor connected between a first node and a second node and including a gate electrode connected to a third node;

a second transistor connected between a data line and the first node and including a gate electrode connected to a first scan line;

a third transistor connected between the second node and the third node and including a gate electrode connected to the first scan line;

a fourth transistor connected between the third node and a reference voltage line and including a gate electrode connected to a second scan line;

a fifth transistor connected between a first voltage line and the first node and including a gate electrode connected to a light emission control line;

a sixth transistor connected between the second node and the anode of the light-emitting device and including a gate electrode connected to the light emission control line;

a seventh transistor connected between the anode of the light-emitting device and the reference voltage line and including a gate electrode connected to a third scan line; and a capacitor including a first electrode connected to the gate electrode of the first transistor and a second electrode connected to the first voltage line;

wherein the gate electrode of the fifth transistor is disposed on a same layer as the first electrode of the capacitor; and wherein the fifth transistor further includes an auxiliary electrode disposed on a same layer as the second electrode of the capacitor and the gate electrode of the second transistor.

12. The light-emitting display apparatus of claim 11, wherein each of the first, fifth and sixth transistors is a P-type transistor, and each of the second, third, fourth and seventh transistors is an N-type transistor.

13. The light-emitting display apparatus of claim 11, wherein each of the first transistor, the fifth transistor, and the sixth transistor further includes a semiconductor active layer having polycrystalline silicon, and wherein each of the second, third, fourth and seventh transistor further includes a semiconductor active layer having an oxide semiconductor.

14. The light-emitting display apparatus of claim 13, wherein the oxide semiconductor includes an oxide of metal including at least one of zinc (Zn), indium (In), gallium (Ga), tin (Sn), and titanium (Ti) or mixtures of metal including at least one of zinc (Zn), indium (In), gallium (Ga), tin (Sn), and titanium (Ti) and oxides thereof.

15. The light-emitting display apparatus of claim 13, wherein the gate electrode of the fifth is disposed on an insulating layer which is disposed on the semiconductor active layer of the fifth transistor.

16. The light-emitting display apparatus of claim 13, wherein the first scan line, the second scan line, and the third scan line are disposed on a same layer as the gate electrode of the second transistor.

17. The light-emitting display apparatus of claim 13, wherein the semiconductor active layer of the second transistor is disposed on the semiconductor active layer of the fifth transistor and the gate electrode of the fifth transistor, and wherein the gate electrode of the second transistor is disposed on the semiconductor active layer of the second transistor.

18. The light-emitting display apparatus of claim 11, wherein a first scan signal, a second scan signal and a third scan signal are transmitted to the first scan line, the second scan line and the third scan line, respectively, and wherein the second scan signal, the first scan signal and the third scan signal are sequentially transition to a high level.

\* \* \* \* \*